US009583180B2

(12) United States Patent
Holst (10) Patent No.: US 9,583,180 B2
(45) Date of Patent: Feb. 28, 2017

(54) LOW-POWER ROW-ORIENTED MEMORY WRITE ASSIST CIRCUIT

(71) Applicant: Cisco Technology, Inc., San Jose, CA (US)

(72) Inventor: John Christian Holst, Saratoga, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/731,678

(22) Filed: Jun. 5, 2015

(65) Prior Publication Data

US 2016/0358644 A1    Dec. 8, 2016

(51) Int. Cl.
*G11C 11/419* (2006.01)

(52) U.S. Cl.
CPC .................. *G11C 11/419* (2013.01)

(58) Field of Classification Search
CPC ................................... G11C 11/419
USPC ................................ 365/154, 156
See application file for complete search history.

(56) References Cited

U.S. PATENT DOCUMENTS

| 7,898,875 | B2 | 3/2011 | Tao | |
|---|---|---|---|---|
| 8,630,132 | B2 | 1/2014 | Cheng | |
| 8,730,712 | B2 | 5/2014 | Choi | |
| 8,958,237 | B1 * | 2/2015 | Yang | G11C 11/419 365/154 |
| 2006/0268626 | A1 * | 11/2006 | Hamzaoglu | G11C 11/413 365/189.04 |
| 2008/0106963 | A1 * | 5/2008 | Wang | G11C 11/418 365/207 |
| 2008/0158939 | A1 * | 7/2008 | Chen | G11C 11/413 365/154 |
| 2012/0014172 | A1 * | 1/2012 | Jung | G11C 11/413 365/154 |
| 2012/0307574 | A1 * | 12/2012 | Cheng | G11C 11/419 365/189.14 |
| 2013/0343135 | A1 * | 12/2013 | Baeck | G11C 7/12 365/189.11 |
| 2014/0146619 | A1 | 5/2014 | Wu et al. | |

OTHER PUBLICATIONS

Zordan et al, "On the Reuse of Read and Write Assist Circuits to Improve Test Efficiency in Low-Power SRAMs," Conference: Test Conference (ITC), 2013 IEEE International, pp. 1-10.
Qazi et al, "Challenges and Directions for Low-Voltage SRAM," Co-published by the IEEE CS and the IEEE CASS, Jan./Feb. 2011, IEEE Design & Test of Computers, pp. 32-43.

* cited by examiner

*Primary Examiner* — Anthan Tran
*Assistant Examiner* — Mushfique Siddique
(74) *Attorney, Agent, or Firm* — Patterson + Sheridan, LLP (57) ABSTRACT

Aspects of the present disclosure generally relate to static random access memory (SRAM), and more specifically, to a low-power, row-oriented memory write assist circuit. The SRAM may generally comprise an array of bit cells arranged in rows and columns, wherein each bit cell in a row is selected for writing via a corresponding wordline for that row and wherein each bit cell in a column is coupled to a corresponding pair of bitlines for supplying complementary data values, and at least one row-oriented write assist circuit configured to temporarily reduce, to a desired voltage level, a voltage on an internal voltage line used to supply power to the bit cells of a row selected for writing.

13 Claims, 9 Drawing Sheets

LOW-POWER ROW-ORIENTED MEMORY WRITE ASSIST CIRCUIT

TECHNICAL FIELD

Embodiments presented herein generally relate to static random access memory (SRAM), and more specifically, to a low-power, row-oriented memory write assist circuit.

BACKGROUND

As integrated circuit lithography has advanced to the current state of reduced printing features (e.g., in the 10-20 nm range or smaller), Static Random Access Memory (SRAM) cells have become much smaller. Unfortunately, the concomitant increase in the variability of individual transistor performance has made it increasingly difficult to maintain robust operation of these memory cells across a wide window of process, voltage, and temperature conditions. The advent of three dimensional transistors, often referred to as "finfet" or "frigate" devices, aggravates this difficulty by quantizing the available transistor sizes. Small adjustments in the relative sizing of access, pull-up and pull-down transistors is no longer possible. As a result of these trends, SRAM designs may need to rely on read and write assist circuits to function properly.

Many read and write assist circuit techniques have been previously developed. Read assist circuits are employed to prevent the memory cell from losing its stored value during a read operation. Write assist circuits are employed to ensure that the memory cell correctly stores the value being written to it. However read and write assist circuits have associated costs, in terms of area and power consumption.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Embodiments of the present disclosure provide a static random access memory (SRAM) device, the SRAM including an array of bit cells arranged in rows and columns, wherein each bit cell in a row is selected for writing via a corresponding wordline for that row and wherein each bit cell in a column is coupled to a corresponding pair of bitlines for supplying complementary data values, and at least one row-oriented write assist circuit configured to temporarily reduce, to a desired voltage level, a voltage on an internal voltage line used to supply power to the bit cells of a row selected for writing.

Embodiments of the present disclosure provide a method for operating a static random access memory (SRAM) device. The method may generally include selecting, from an array of bit cells arranged in rows and columns, a row for writing via a corresponding wordline for that row, wherein each bit cell in a column is coupled to a corresponding pair of bitlines for supplying complementary data values and temporarily reducing, to a desired voltage level, a voltage on an internal voltage line used to supply power to the bit cells of the selected row selected.

Embodiments of the present disclosure provide logic encoded in one or more tangible media for execution and when executed operable to select, from an array of bit cells arranged in rows and columns, a row for writing via a corresponding wordline for that row, wherein each bit cell in a column is coupled to a corresponding pair of bitlines for supplying complementary data values and temporarily reduce, to a desired voltage level, a voltage on an internal voltage line used to supply power to the bit cells of the selected row.

Example Embodiments

Static random access memories (SRAMs) are commonly used in integrated circuits and have the advantageous feature of holding data without a need for refreshing. SRAM are typically formed of a plurality of bit cells arranged as an array having rows and columns. Bit cells may include different numbers of transistors that typically form a data latch for storing a bit. Additional transistors may be added to control the access to the transistors. Typically, each row of bit cells is connected to a word-line, which determines whether the current bit cell is selected or not. Each column of bit cells is connected to a bit-line (or a pair of bit-lines), which is used for storing a bit into, or reading a bit from, the bit cell. It should be noted that the terms bit cell, memory cell, cell, storage cell, and/or SRAM cell, as used herein, may be used interchangeably.

With the increasing down-scaling of integrated circuits, the operational voltages of integrated circuits are reduced, along with the operational voltages of memory circuits. Accordingly, read and write margins of the bit cells, which measure how reliably the bits of the bit cells can be read from and written into, are reduced. For this reason, SRAMs may need to rely on read and write assist circuits to function properly.

As noted above, write assist circuits are employed to ensure that the memory cell correctly stores a value being written to a particular bit cell. Aspects of the present disclosure provide a write assist circuit that consumes very low power and very little area.

Figure 1:
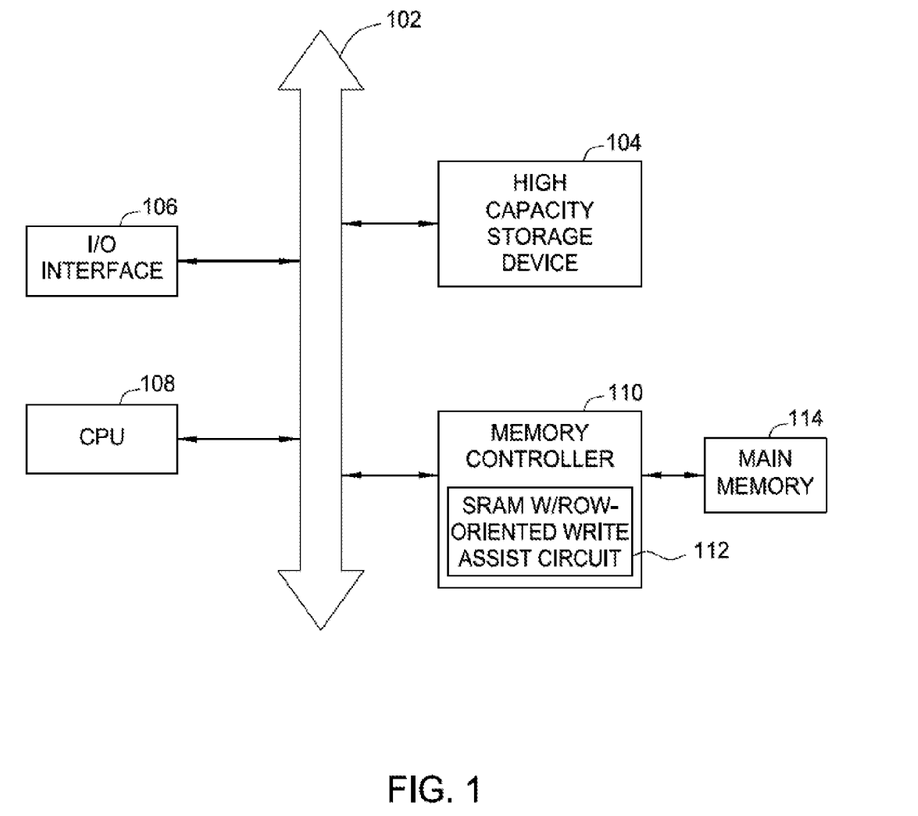
FIG. 1 illustrates a general block diagram of computing system with an SRAM in accordance with certain aspects of the present disclosure.

FIG. 1 illustrates an example of a computing system 100, according to certain embodiments of the present disclosure. The computing system 100 comprises a high capacity storage device 104, an input/output (I/O) interface 106, a central processing unit (108), a memory controller 110, and a main memory 114, which are connected with one another via a system bus 102. As illustrated, the memory controller 110 may include an SRAM device 112. As will be described in greater detail below, the SRAM device 112 may include a row-oriented write assist circuits, in accordance with aspects of the present disclosure.

The high capacity storage device 104 may comprise a solid state drive (SSD), a hard disk drive (HDD), and/or a network-attached storage (NAS). The main memory 114 may comprise flash memory, phase-change RAM (PRAM), and/or magnetic RAM (MRAM).

The I/O interface 106 may comprise a keyboard, a mouse, a monitor display, and/or any other type of device that is capable of inputting or outputting information to/from the computing system 100. In some cases, the I/O interface 106 may be connected with a network port that can be connected to a network or may be directly connected with the network.

During operation of the computing system 100, the CPU 108 may control the operation of the memory controller 110 and the main memory 114. In some cases the memory controller 110 controls the main memory 114.

While the computing system 100 illustrates particular components, it should be understood that these components may be interchanged. For example, the CPU 108 may be any type of CPU and the main memory 114 may be any one of various types of memory. It should also be understood that the computing system 100 is not restricted to the embodiment illustrated in FIG. 1 and may further include other components.

The computing system 100 illustrated in FIG. 1 is just an example of a computing system including the SRAM device 112. The SRAM device 112 may be used in any computing systems requiring SRAM.

Figure 2:
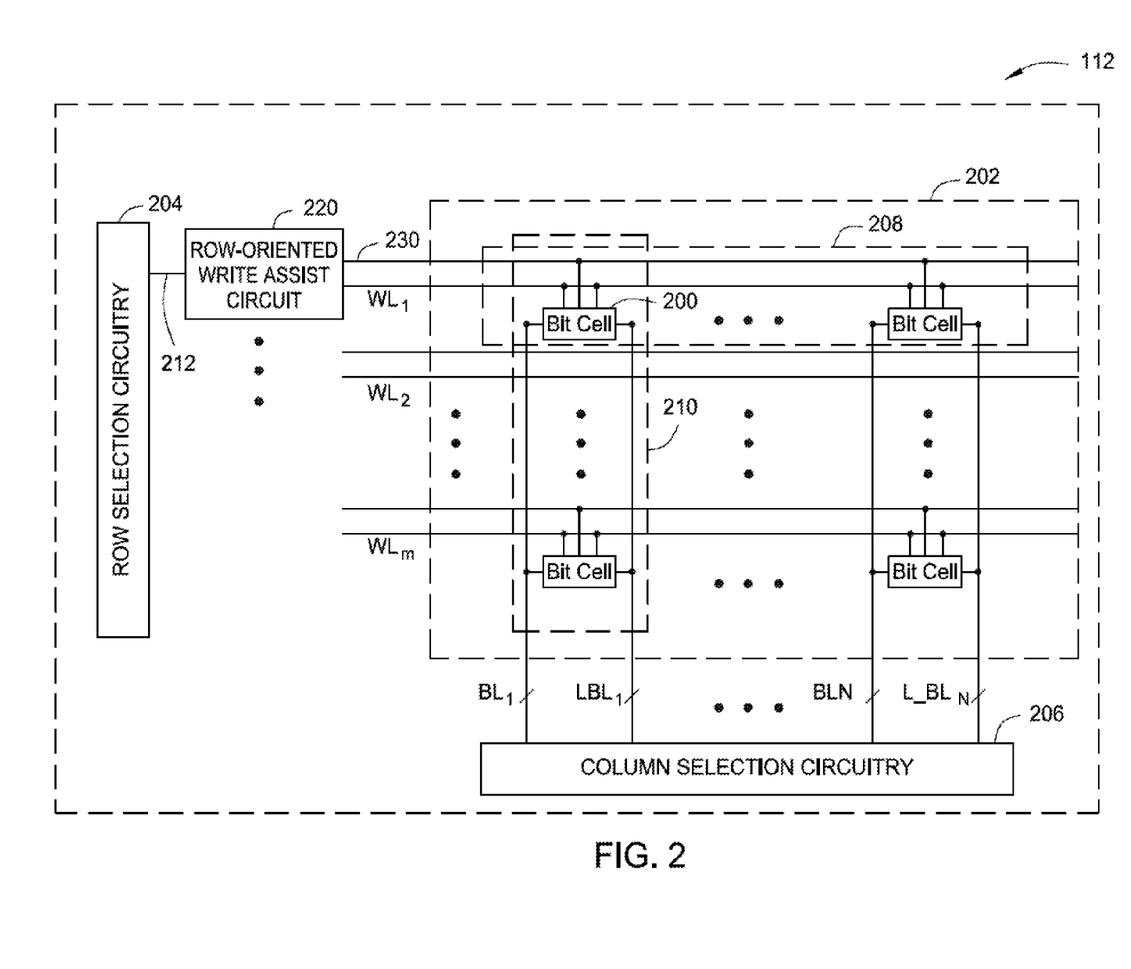
FIG. 2 illustrates a block diagram of an SRAM in accordance with certain aspects of the present disclosure.

FIG. 2 illustrates a more detailed view of the SRAM device 112, with row-oriented write-assist circuits, in accordance with certain aspects of the present disclosure. SRAM device includes a plurality of word lines (e.g., $WL_1$, $WL_2$, $WL_m$) and a plurality of bit line pairs (e.g., $BL_1$ and $LBL_1$, ..., $BL_N$ and $LBL_N$) arranged in a matrix to form a bit cell array 202 comprising a plurality of bit cells 200. The SRAM device may also include row selection circuitry 204, column selection circuitry 206, and a plurality of row-oriented write assist circuits 220.

The plurality of bit line pairs (i.e., $BL_1$ and $LBL_1$, ..., $BL_N$ and $LBL_N$) are arranged to cross the plurality of word lines $WL_1$ through $WL_m$ in the bit cell array 202. The bit line pairs comprise bit lines $BL_1$ through $BL_N$ paired with complementary low bit lines $LBL_1$ through $LBL_N$, respectively.

According to certain aspects, row selection circuitry 204 may be used to select one or more word lines from the plurality of word lines $WL_1$ through $WL_m$, in response to an externally provided row address. According to certain aspects, selecting one or more word lines may involve providing a WL decode signal on a WL decode line (e.g., WL decode line 212). The WL decode signal may be asserted, for example, by a memory controller when a corresponding address of the SRAM is to be accessed.

According to certain aspects, the column selection circuitry 206 may comprise various components for selecting pairs of bit lines, providing input data to be written to a selected bit cell, and/or reading information from a selected bit cell. For example, the column selection circuitry 206 may comprise a column decoder that may be used to generate, in response to externally provided column address(es), and output a column selection signal that selects one or more bit line pairs among the plurality of bit line pairs. In some cases, a column selection switch selects the pair(s) of bit lines indicated by the column selection signal.

The column selection circuitry 206 may also include a write buffer that may be used to receive input data provided by an external device and write the input data to a selected bit cell during a write operation, explained in greater detail below with reference to FIG. 4A. During a read operation directed to a selected bit cell, which will be explained in greater detail below with reference to FIG. 4B, a sense amplifier/write driver included within the column selection circuitry 206 may be used to amplify a voltage difference between a bit line and a complementary bit line that are connected with the selected bit cell in order to generate output data.

As noted above, the bit cell array 202 comprises a plurality of bit cells 200, which are arranged in such a way to form a plurality of rows of bit cells and a plurality of columns of bit cells, as illustrated in FIG. 2. Each of the bit cells 200 is connected to one of the plurality of word lines $WL_1$ through $WL_m$ and between one of the plurality of bit lines $BL_1$ through $BL_N$ and its corresponding complementary low bit line $LBL_1$ through $LBL_N$. For example, as illustrated in FIG. 2 bit cell 200 may be connected with word line $WL_1$ and connected between bit lines $BL_1$ and $LBL_1$. Each bit cell 200 may be used to store data written thereto during a write operation.

As noted above, the SRAM device 112 may further comprise one or more row-oriented write assist circuit(s) 220. As illustrated in FIG. 2, one row-oriented write assist circuit 220 is associated with a bit cell 200 disposed in a single row 208. According to certain aspects, each bit cell in a particular row (e.g., row 208) of the bit cell array 202 may be associated (i.e., connected via an internal voltage line 230) with the same write assist circuit (e.g., row-oriented write assist circuit 220). It should be noted that in this context, the term "row" refers to an arrangement of one word line (e.g., $WL_1$) as it traverses at least a portion of the bit cell array 202 across one or more bit line pairs (e.g., $BL_1$ and $LBL_1$). It should also be noted that in this context, the term "column" refers to an arrangement of one bit line pair (e.g., $BL_1$ and $LBL_1$) as it traverses at least a portion of the bit cell array 202 across one or more word lines (e.g., $WL_1$, $WL_2$, ..., $WL_m$). For example, FIG. 2 illustrates a column 210 of bit cells.

Figure 3:
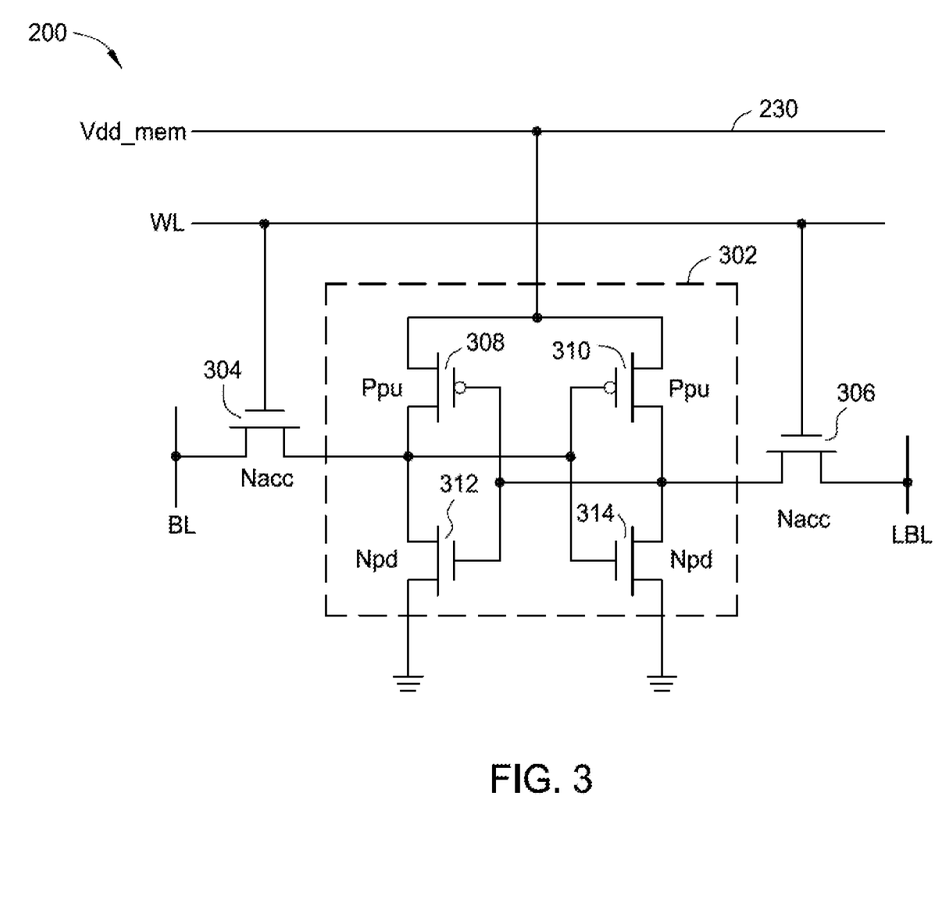
FIG. 3 illustrates a circuit diagram of an example bit cell, with which assist circuits in accordance with certain aspects of the present disclosure may be utilized.

FIG. 3 illustrates a detailed view of a bit cell 200 in accordance with certain aspects of the present disclosure. It should be noted that the embodiment shown in FIG. 3 is one of various possible embodiments of a bit cell 200.

As noted above, the bit cell 200 may be connected with a word line WL and between a pair of bit line BL/LBL running perpendicular to the word line WL. The bit cell 200 may comprise a memory cell 302 connected between the pair of bit line BL/LBL by an n-channel field-effect transistor (NFET) access (Nacc) transistor 304 and an Nacc transistor 306.

As illustrated in FIG. 3, when performing read or write operations, Nacc transistor 304 connects the bit line BL to the memory cell 302 when a word line WL is activated. Similarly, Nacc transistor 306 connects the complementary bit line LBL when the word line WL is activated.

Figure 4A:
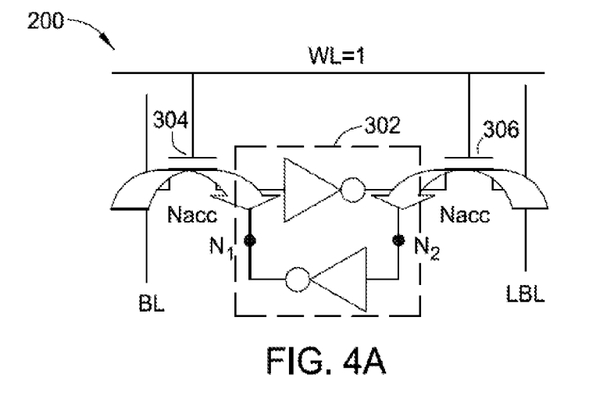
FIGS. 4A-4C illustrate example bit cell writing, reading and holding operations, respectively, in accordance with certain aspects of the present disclosure.
Figure 4B:
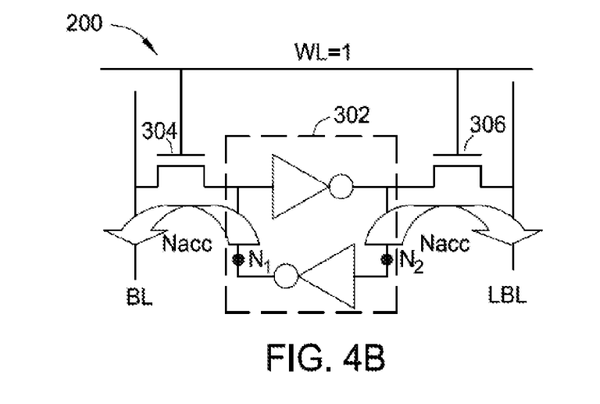
Figure 4C:
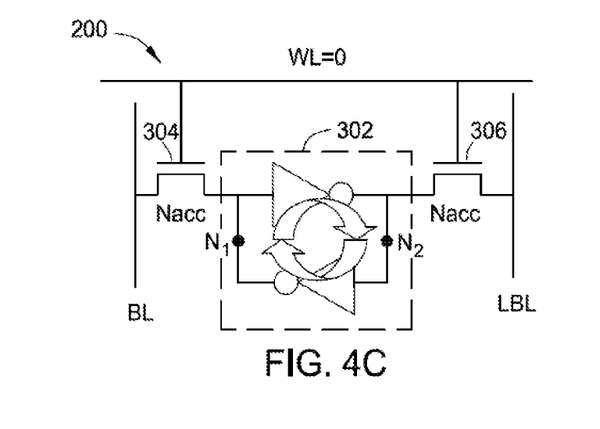

FIGS. 4A-4C illustrate simplified write, read, and hold operations of a bit cell 200 in accordance with certain aspects of the present disclosure. As illustrated in FIGS. 4A-4C, the memory cell 302 of bit cell 200 may be represented as two cross-coupled inverters capable of storing data for reading and writing.

FIG. 4A illustrates an exemplary write operation of the bit cell 200. For example, as illustrated, when a WL is logically high (i.e., WL=1) the Nacc transistors 304 and 306 may be turned on and data (i.e., voltage) applied to the pair of bit lines (i.e., BL and LBL) may be written into and stored at nodes $N_1$ and $N_2$ of the memory cell 302. For example, during a write operation, BL and LBL may be driven to complementary values by the column selection circuitry (e.g., driven to a high (VCC) and low (VSS) supply voltage, respectively), which may be stored at nodes $N_1$ and $N_2$ of the memory cell 302.

As illustrated in FIG. 4B, during a read operation, the word line may be set to 1 (i.e., logically "high"), the Nacc transistors 304 and 306 may be turned on, and, in contrast to the write operations described above, the bit lines may be biased at an "equilibrated" voltage (e.g., maintained at the same high VCC supply voltage). The information stored at nodes $N_1$ and $N_2$ of the memory cell may then be read using, for example, a sense amplifier that may be included in the column selection circuitry 206 as previously discussed with reference to FIG. 2.

FIG. 4C illustrates holding operations of a bit cell 200. For example, as illustrated, when a WL is logically low (i.e., WL=0), the Nacc transistors 304 and 306 may be turned off and data written to the memory cell 302 during write operations may be held/stored at nodes $N_1$ and $N_2$ so long as the memory cell continues to receive a power supply voltage (e.g., via an internal voltage line 230, not pictured).

With respect to the write, read, and hold operations illustrated FIGS. 4A-4C, the design of SRAM cells has traditionally involved a compromise between the read and write operations of the memory array to maintain cell stability, read performance and write performance. In particular, the transistors which make up the cross-coupled latch (e.g., Ppu transistors 308 and 310 and Npd transistors 312 and 314) must be weak enough to be overdriven during a write operation, while also strong enough to maintain their data value when driving a bit line during a read operation. This compromise between read operations and write operations for an SRAM becomes more of an issue as integrated circuits are scaled down in size. In particular, read and write margins of the SRAM cells, which measure how reliably the bits of the SRAM cells can be read from and written into, are reduced as the operation voltages of the integrated circuits are reduced with the down-scaling of the circuits. These reduced read and write margins may consequently cause errors in the respective read and write operations for the SRAM cells. For example, as SRAM designs are scaled down, the operating voltages may not be high enough to overcome the cross-coupled inverters constructed from the Ppu and Npd transistors of a particular memory cell, resulting in write errors. Thus, write assist circuits are often added to SRAM designs in order to "weaken" the cross-coupled inverters, making it easier to write to the memory cell.

Figure 5:
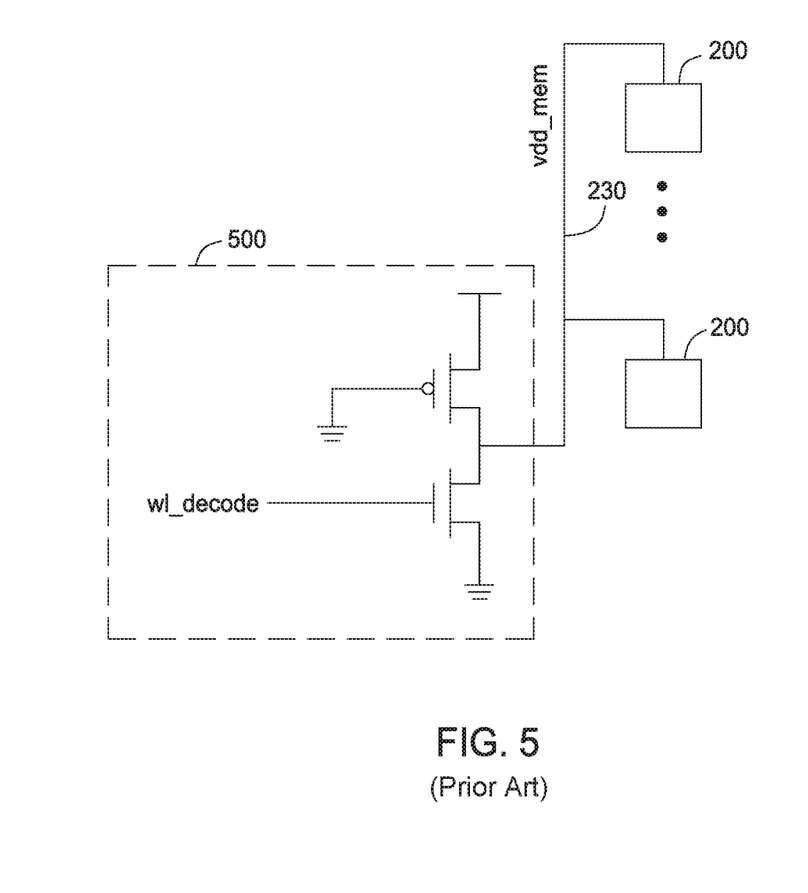
FIG. 5 illustrates an example circuit diagram of a column-oriented write-assist circuit.

FIG. 5 illustrates one example of a write assist circuit 500 that is commonly used in SRAM designs. The write assist circuit 500 may be referred to as a column-oriented write assist circuit (as opposed to a row-oriented write assist circuit illustrated below in FIG. 6). In this scenario, the write assist circuit 500 will temporarily lower a voltage (e.g., Vdd_mem power supply voltage) on an internal voltage line 230 for the bit cells 200. For example, a Vdd_mem power supply voltage may be internally supplied to source terminals of the Ppu transistors 308 and 310 of the bit cell 200 of FIG. 3, during write operations. Lowering the Vdd_mem power supply voltage during a write operation may reduce the drive currents of the transistors that comprise the cross-coupled inverters (i.e., Ppu transistors 308 and 310 and Npd transistors 312 and 314) in the memory cell 302, making it easier for the access transistors (Nacc transistors 304 and 306) of the bit cell 200 to drive/write new data into the memory cell 302.

The area needed by the write assist circuit illustrated in FIG. 5 may be relatively small, as it consists of just two additional transistors for each column (e.g., column 210) of memory cells. The additional cost in power consumption, however, is significant as the Vdd_mem power supply voltage for an entire column of memory cells is discharged and then charged for each bit of data written. For example, if an 8-bit word is being written, the power supply voltage for 8 columns of memory cells discharged and then recharged.

In addition to the additional cost in power, the amount by which the Vdd_mem power supply voltage can be reduced is limited for this type write assist circuit. For example, during a write operation, since the power supply voltage is tied to all of the non-accessed memory cells in the column (e.g., column 210) and since bits of a word are written along a row of bit cells (e.g., row 208), the power supply voltage must remain high enough for the non-accessed bit cells to retain their stored data. Otherwise, if the power supply voltage is reduced too far, bits of stored data in other rows may be lost. Therefore, the maximum effect of this write assist circuit is limited. Additionally, is should also be noted that this write assist circuit is not compatible with multi-port SRAM designs due to the possibility that a read port may access a different bit cell in the column that is being written to. Reducing the supply voltage of a bit cell that is performing a read operation could result in that bit cell losing its stored data.

Aspects of the present disclosure, however, provide a row-oriented write assist circuit that may temporarily reduce the internal supply voltage to the cells of a selected row. As will be described in greater detail below, this approach may result in reduced power consumption (relative to a column-oriented approach) while maintaining the reliability of stored data.

Figure 6:
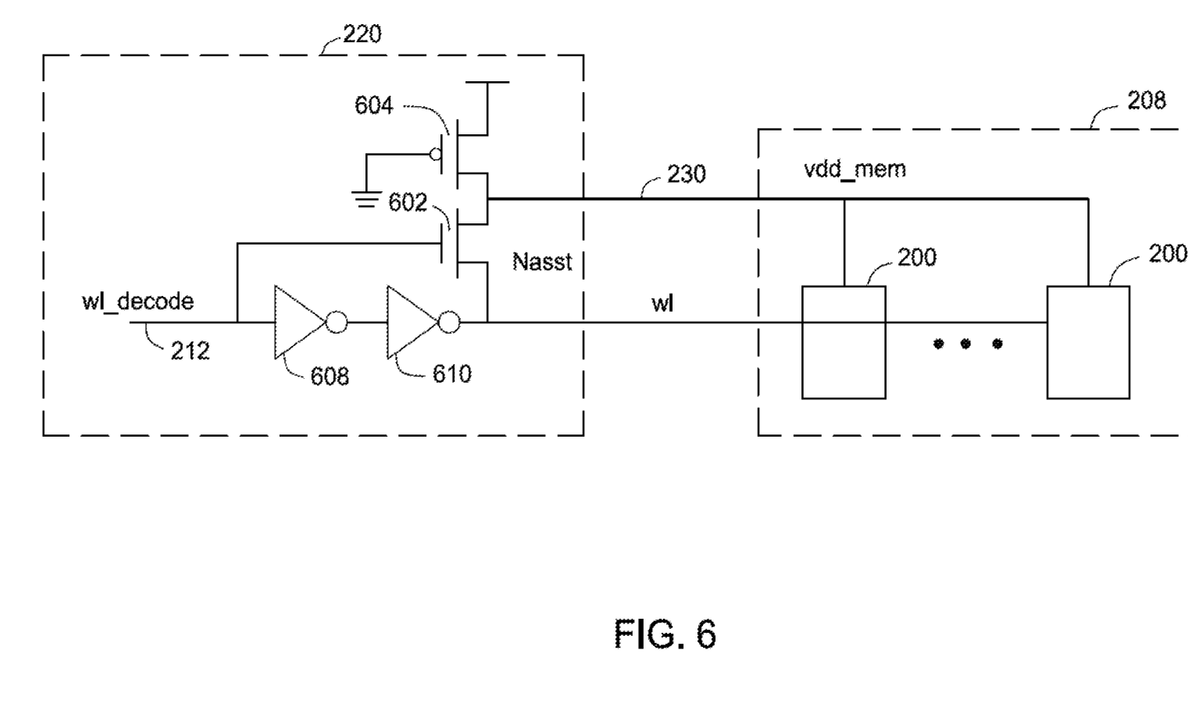
FIG. 6 illustrates an example circuit diagram of a row-oriented write-assist circuit, in accordance with certain aspects of the present disclosure.

FIG. 6 illustrates a row-oriented write assist circuit 220, in accordance with certain aspects of the present disclosure.

As illustrated in FIG. 6, the row-oriented write assist circuit 220, may comprise a PFET transistor 604, an NFET assist (Nasst) transistor 602, and two WL inverters/drivers 608 and 610. For example, during a write operation, the Vdd_mem power supply voltage provided on the internal voltage line 230 may be temporarily reduced (e.g., by coupling the internal voltage line 230 to the wordline WL) via Nasst transistor 602. This reduction in the Vdd_mem power supply voltage may make it easier for the access transistors to drive (i.e., write) new data into the cells of the row.

Figure 7:
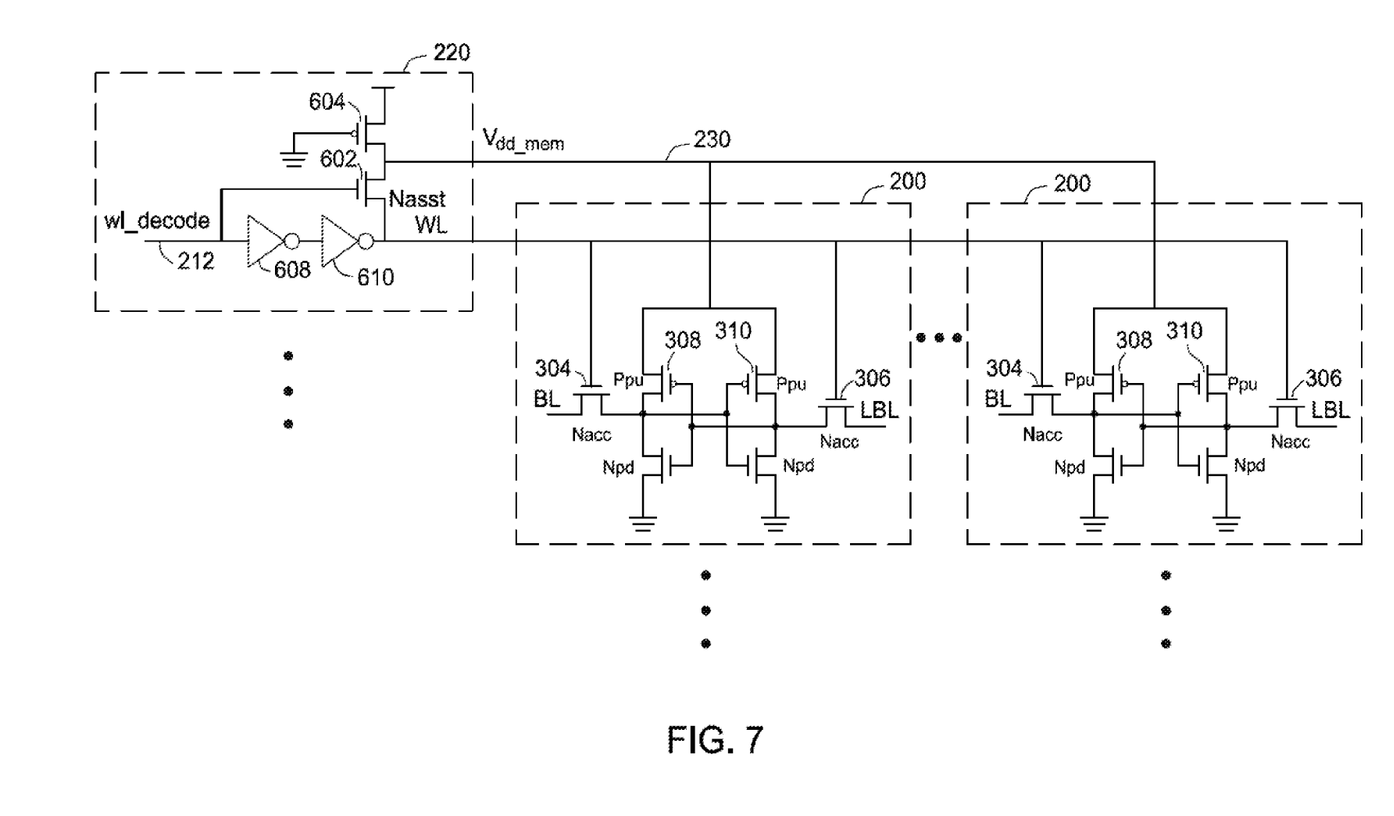
FIG. 7 illustrates an example circuit diagram of a row-oriented write-assist circuit in greater detail, in accordance with certain aspects of the present disclosure.

It should be noted that while FIGS. 6 and 7 illustrate one possible configuration of the row-oriented write assist circuit 220, other configurations may be possible. For example, while not shown, the PFET transistor 604 of the row-oriented write assist circuit 220 may be replaced with a resistor of an appropriate value or any type of resistive structure. Additionally, in another configuration, the gate of the PFET transistor 604 may be connected with the WL decode line 212, which may prevent the PFET 604 from charging the Vdd_mem power supply voltage and WL back high while the Nasst transistor 602 and the WL inverters/drivers 608 and 610 try to pull the Vdd_mem power supply voltage and WL low. This may achieve a slightly lower voltage on the internal voltage line 230 and less "through" current.

As illustrated in greater detail in FIG. 7, the internal voltage line 230, which is connected between the second terminal of the PFET transistor 604 and the first terminal of the Nasst transistor 602, may be connected with the bit cells 200 via the Ppu transistors 308 and 310. According to certain aspects, the internal voltage line 230 may provide the bit cell 200 with a power supply voltage, which enables the bit cell 200 to retain data.

According to certain aspects, the word line WL of FIGS. 6 and 7, which may be connected with the second (output) terminal of the WL inverter/driver 610 and the second terminal of the Nasst transistor 602, may be connected with the bit cells 200 via Nacc transistors 304 and 306.

As shown in FIGS. 6 and 7, the row-oriented write assist circuit 220 may be connected with each bit cell of a row of bit cells (e.g., row 208) in a bit cell array (e.g., bit cell array 202). According to certain aspects, each row of the bit cell array 202 may be associated with its own row base write assist circuit.

Another potential advantage to a row-oriented write circuit as described herein may be a potential "pre-charging" of the wordline. For example, subsequent to a write operation, the Vdd_mem power supply voltage on the internal voltage line 230 may be reduced, passing through the Nasst transistor 602 to help charge the wordline WL "HIGH".

Figure 8:
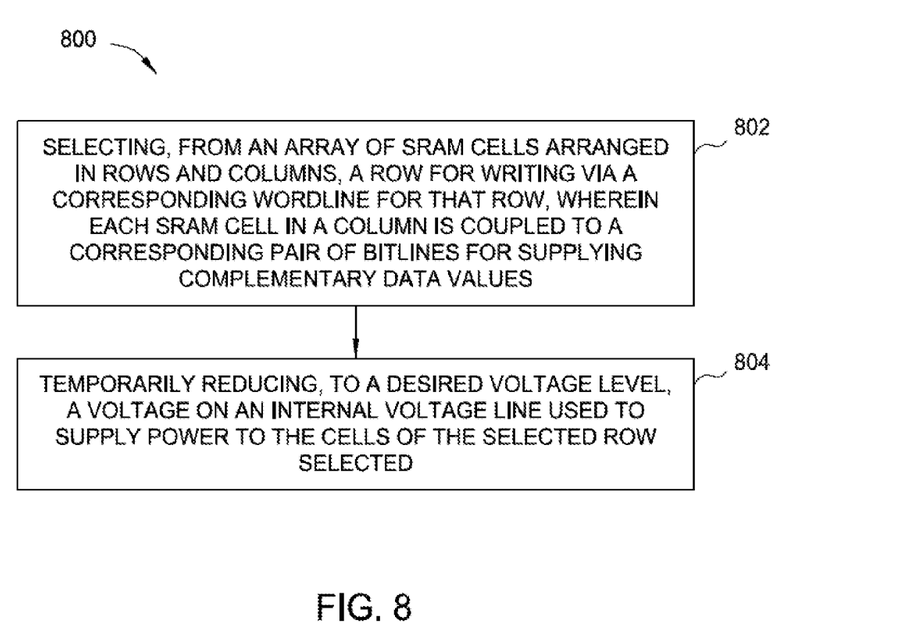
FIG. 8 illustrates example operations for operating a static random access memory (SRAM), which may include a row-oriented write assist circuit, in accordance with certain aspects of the present disclosure.

FIG. 8 illustrates example operations 800 that correspond to the row-oriented write assist mechanism presented herein. For example, the operations 800 may be performed by the components described above, such as the memory controller 110 of FIG. 1 utilizing the row-oriented write assist circuit 220.

Operations 800 begin, at 802, by selecting, from an array of SRAM cells arranged in rows and columns, a row for writing via a corresponding wordline for that row, wherein each SRAM cell in a column is coupled to a corresponding pair of bitlines for supplying complementary data values. For example, the selecting may occur after the memory controller performs a decoding operation given an SRAM address to write to.

At 804, a voltage on an internal voltage line used to supply power to the cells of the selected row is temporarily reduced to a desired voltage level. For example, the row-oriented write assist circuit 220 may reduce the Vdd_mem power supply voltage during a write operation, as described above.

According to certain aspects, the row-oriented write assist circuit 220 may provide various advantages over the traditional column-oriented write assist circuit 500. For example, a first advantage of the row-oriented write assist circuit 220 is that it may provide significantly lower power dissipation. For example, the row-oriented write assist circuit 220 only discharges the Vdd_mem power supply voltage for bits that are actually being written. If a memory array is constructed with 128 bits connected to each bit line (a common configuration), this row-oriented write assist scheme may consume approximately $\frac{1}{128}$ as much power as the column-oriented approach. This power consumption reduction is due to the fact that, since bits are written along a row of bit cells, only the power to one row of bit cells would need to be discharged with the row-oriented write assist circuit 220 to write a 128-bit word, whereas with the column-oriented write assist circuit 500, the power to 128 columns of bit cells would need to be discharged to write the same 128-bit word since each column has its own write assist circuit.

A second advantage of the row-oriented write assist circuit 220 is that charge supplied on the internal voltage line 230 may be conserved for other uses. For example, when discharging the internal voltage line 230 during a write operation, the charge on the internal voltage line 230 may be used to help drive the word line WL "HIGH" that is connected to that bit cell. This reuse (or recycling) of the charge on the internal voltage line to charge the word line may reduce power consumption.

Another advantage of the row-oriented write assist circuit 220 is that it may allow for a very strong write assist. For example, since every memory cell connected with the internal voltage line 230 will be written, the Vdd_mem power supply voltage provided by the internal voltage line 230 may be discharged to an arbitrarily low voltage. That is, unlike the column-oriented write assist circuit where reducing the power supply voltage may result in bit cells of non-accessed rows losing their stored information, with the row-oriented write assist circuit, since bits of a word are written along the row of a bit cell array, and since the power supply voltage supplied by the row-oriented write assist circuit is supplied to rows of bit cells rather than columns, the power supply voltage may be reduced to an arbitrarily low voltage without the risk of losing bits of information stored in non-accessed rows.

In some cases, the amount by which the Vdd_mem power supply voltage may be discharged may be limited by the fact that the voltage on WL is rising (i.e., the WL is increasing in voltage with charge that is transferred from the internal voltage line 230). If the capacitance of internal voltage line is much larger than the capacitance of the WL, a simple charge-sharing model would show that the WL voltage may rise more than the Vdd_mem power supply voltage may fall. Thus, if Nasst transistor 602 is unable to discharge the Vdd_mem power supply voltage to a suitably low voltage, the Nasst transistor 602 may be augmented with a parallel NFET transistor (e.g., Nasst2 transistor 612) that that has its source connected to VSS (e.g., ground GND) instead of the WL, as illustrated in FIG. 9.

Figure 9:
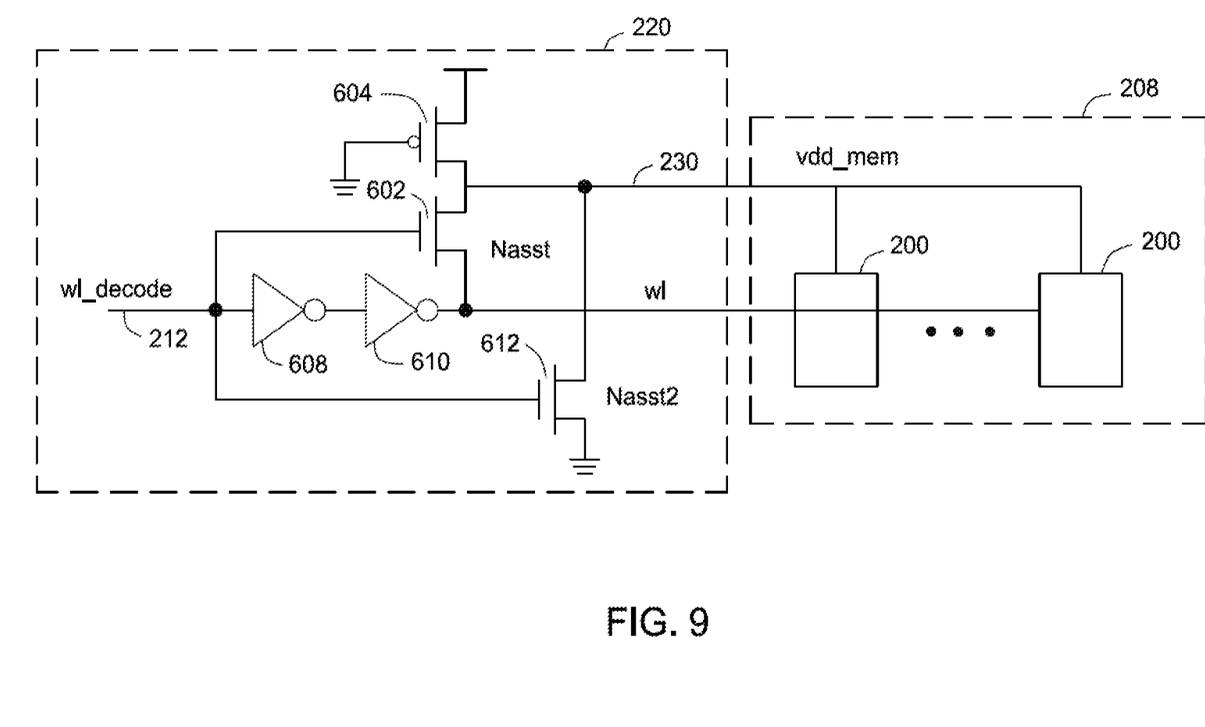
FIG. 9 illustrates an example circuit diagram of a row-oriented write-assist circuit in greater detail, in accordance with certain aspects of the present disclosure.

According to certain aspects, Nasst2 transistor 612 of FIG. 9 may discharge the Vdd_mem power supply voltage as long as a wl_decode signal on WL decode line 212 is high. This behavior is different than that of Nasst transistor 602, which turns off with the rising WL voltage. The operation of the Nasst2 transistor 612 may not have the same power-saving advantage of the Nasst transistor 602, but it may be added to achieve a further discharge of the Vdd_mem power supply voltage.

Another advantage of the row-oriented write assist circuit is that it can be used for multi-port memories. Since the row-oriented write assist only impacts memory cells addressed by its associated write port, it may not interfere with the operation of other read and write ports.

Another advantage of the row-oriented write assist circuit 220 is that it may require no timing support circuitry to assist in the discharging of the internal voltage line. For example, as the voltage of the word line rises (due in part to the voltage from the internal voltage line being discharged onto the word line), the increase in voltage on the word line naturally turns off the Nasst transistor 602, ending the discharge event on the internal voltage line for a particular row of bit cells. Since no additional timing support circuitry is needed, this reduces the area, design effort, and power consumption of the SRAM device (e.g., SRAM device 112).

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Aspects of the present disclosure may be a system, a method, and/or a computer program product. The computer program product may include a computer readable storage medium (or media) having computer readable program instructions (e.g., logic) thereon for causing a processor to carry out aspects described herein.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-oriented systems that perform the specified functions or acts, or combinations of special purpose hardware and computer instructions.

In view of the foregoing, the scope of the present disclosure is determined by the claims that follow.

I claim:

1. A static random access memory (SRAM) device, the SRAM device comprising:
    an array of bit cells arranged in rows and columns, wherein each bit cell in a row is selected for writing via a corresponding wordline for that row and wherein each bit cell in a column is coupled to a corresponding pair of bitlines for supplying complementary data values; and
    for each row of the array of bit cells, a row-oriented write assist circuit configured to temporarily reduce, to a desired voltage level, a voltage on an internal voltage line used to supply power to those bit cells of the row when the row is selected for writing, wherein:
        the write assist circuit temporarily increases a voltage on the corresponding wordline by coupling the corresponding wordline to the internal voltage line; and
        the write assist circuit is configured to stop reducing the voltage on the internal voltage line when the voltage on the corresponding wordline exceeds a threshold voltage.

2. The SRAM device of claim 1, wherein the write assist circuit comprises:
    a P-type field effect transistor (PFET) having a first terminal coupled with a supply voltage, a second terminal coupled with the internal voltage line; and
    at least a first N-type field effect transistor (NFET) having a first terminal coupled with the internal voltage line, a second terminal coupled with the corresponding wordline, and a gate coupled with a node that is activated when a decoding circuit selects the row for writing.

3. The SRAM device of claim 2, wherein the write assist circuit further comprises at least two inverters coupled in series between the node and the corresponding wordline.

4. The SRAM device of claim 3, wherein the write assist circuit further comprises at least one additional NFET coupled in parallel with the first NFET, the additional NFET having a source terminal connected to a negative supply voltage.

5. The SRAM device of claim 1, wherein the internal voltage line is used to supply power to only those bit cells of the row when the row is selected for writing.

6. The A method of operating a static random access memory (SRAM) device, comprising:
    selecting, from an array of bit cells arranged in rows and columns, a row for writing via a corresponding wordline for that row, wherein each bit cell in a column is coupled to a corresponding pair of bitlines for supplying complementary data values;
    for each bit cell of the selected row, temporarily reducing, to a desired voltage level, a voltage on an internal voltage line used to supply power to those bit cells of the selected row;
    temporarily increasing a voltage on the corresponding wordline by coupling the corresponding wordline to the internal voltage line; and
    stopping the reducing of the voltage on the internal voltage line when the voltage on the corresponding wordline exceeds a threshold voltage.

7. The method of claim 6, wherein temporarily reducing the voltage on the internal voltage line is performed by a write assist circuit, wherein the write assist circuit comprises:
    a P-type field effect transistor (PFET) having a first terminal coupled with a supply voltage, a second terminal coupled with the internal voltage line; and
    at least a first N-type field effect transistor (NFET) having a first terminal coupled with the internal voltage line, a second terminal coupled with the corresponding wordline, and a gate coupled with a node that is activated when a decoding circuit selects the row for writing.

8. The method of claim 7, wherein the write assist circuit further comprises at least two inverters coupled in series between the node and the corresponding wordline.

9. The method of claim 8, wherein the write assist circuit further comprises at least one additional NFET coupled in parallel with the first NFET, the additional NFET having a source terminal connected to a negative supply voltage.

10. A non-transitory computer readable storage medium comprising computer readable program instructions stored thereon for causing a processor to:
    select, from an array of bit cells arranged in rows and columns, a row for writing via a corresponding wordline for that row, wherein each bit cell in a column is coupled to a corresponding pair of bitlines for supplying complementary data values; and
    for each bit cell of the selected row, temporarily reduce, to a desired voltage level, a voltage on an internal voltage line used to supply power to those bit cells of the selected row;
    temporarily increase a voltage on the corresponding wordline by coupling the corresponding wordline to the internal voltage line; and
    stop reducing the voltage on the internal voltage line when the voltage on the corresponding wordline exceeds a threshold voltage.

11. The non-transitory computer readable medium of claim 10, wherein the computer readable program instructions for causing the processor to temporarily reduce the voltage on the internal voltage line causes the processor to temporarily reduce the voltage on the internal voltage line via a write assist circuit, wherein the write assist circuit comprises:
    a P-type field effect transistor (PFET) having a first terminal coupled with a supply voltage, a second terminal coupled with the internal voltage line; and
    at least a first N-type field effect transistor (NFET) having a first terminal coupled with the internal voltage line, a second terminal coupled with the corresponding wordline, and a gate coupled with a node that is activated when a decoding circuit selects the row for writing.

12. The non-transitory computer readable medium of claim 11, wherein the write assist circuit further comprises at least two inverters coupled in series between the node and the corresponding wordline.

13. The non-transitory computer readable medium of claim 12, wherein the write assist circuit further comprises at least one additional NFET coupled in parallel with the first NFET, the additional NFET having a source terminal connected to a negative supply voltage.

* * * * *

UNITED STATES PATENT AND TRADEMARK OFFICE
CERTIFICATE OF CORRECTION

| | | |
|---|---|---|
| PATENT NO. | : 9,583,180 B2 | Page 1 of 1 |
| APPLICATION NO. | : 14/731678 | |
| DATED | : February 28, 2017 | |
| INVENTOR(S) | : John Christian Holst | |

It is certified that error appears in the above-identified patent and that said Letters Patent is hereby corrected as shown below:

In the Specification

In Column 8, Line 53, delete "that that" and insert -- that --, therefor.

In the Claims

In Column 12, Line 1, in Claim 6, delete "The A" and insert -- A --, therefor.

Signed and Sealed this
Sixth Day of June, 2017

Michelle K. Lee
*Director of the United States Patent and Trademark Office*